US011050011B2

(12) United States Patent
Dardona et al.

(10) Patent No.: US 11,050,011 B2
(45) Date of Patent: Jun. 29, 2021

(54) SENSOR ASSEMBLY FOR GAS TURBINE ENGINES

(71) Applicant: United Technologies Corporation, Farmington, CT (US)

(72) Inventors: Sameh Dardona, South Windsor, CT (US); Andrew Consiglio, Southbury, CT (US)

(73) Assignee: RAYTHEON TECHNOLOGIES CORPORATION, Farmington, CT (US)

( * ) Notice: Subject to any disclaimer, the term of this patent is extended or adjusted under 35 U.S.C. 154(b) by 804 days.

(21) Appl. No.: 15/844,711

(22) Filed: Dec. 18, 2017

(65) Prior Publication Data
US 2019/0189901 A1 Jun. 20, 2019

(51) Int. Cl.
| | |
|---|---|
| H01L 41/113 | (2006.01) |
| F01D 17/02 | (2006.01) |
| H04B 7/24 | (2006.01) |
| F01D 17/04 | (2006.01) |
| F01D 11/20 | (2006.01) |
| H01L 41/08 | (2006.01) |
| G01H 11/08 | (2006.01) |
| G01L 1/16 | (2006.01) |
| G01L 9/08 | (2006.01) |

(52) U.S. Cl.
CPC .......... *H01L 41/1132* (2013.01); *F01D 11/20* (2013.01); *F01D 17/02* (2013.01); *F01D 17/04* (2013.01); *H01L 41/081* (2013.01); *H04B 7/24* (2013.01); *F05D 2270/80* (2013.01); *F05D 2300/18* (2013.01); *G01H 11/08* (2013.01); *G01L 1/16* (2013.01); *G01L 9/08* (2013.01)

(58) Field of Classification Search
CPC ........................ H01L 41/1132; H01L 41/081
USPC ..... 310/313 R, 313 A, 313 B, 313 C, 313 D, 310/338
See application file for complete search history.

(56) References Cited

U.S. PATENT DOCUMENTS

| | | | |
|---|---|---|---|
| 4,158,217 A | 6/1979 | Bell | |
| 9,437,933 B2 | 9/2016 | Georgescu et al. | |
| 2013/0027144 A1* | 1/2013 | Yamanaka | ........... H03H 9/0585 331/155 |
| 2013/0342360 A1 | 12/2013 | Bevly, III | |
| 2015/0244344 A1* | 8/2015 | Mitchell | ............... G01M 15/14 310/313 B |
| 2016/0305271 A1 | 10/2016 | Schmidt et al. | |
| 2017/0070204 A1 | 3/2017 | McIntyre | |

FOREIGN PATENT DOCUMENTS

| | | |
|---|---|---|
| DE | 102015105357 | 11/2015 |
| EP | 1026823 | 2/2000 |

OTHER PUBLICATIONS

European Search Report for European Patent Application No. 18213725.7 completed Apr. 15, 2019.

* cited by examiner

*Primary Examiner* — Derek J Rosenau
(74) *Attorney, Agent, or Firm* — Carlson, Gaskey & Olds, P.C.

(57) ABSTRACT

A sensor assembly for a gas turbine engine according to an example of the present disclosure includes, among other things, a substrate layer formed on a localized surface of a rotatable gas turbine engine component, and at least one pair of transducers deposited on the substrate layer.

20 Claims, 4 Drawing Sheets

SENSOR ASSEMBLY FOR GAS TURBINE ENGINES

BACKGROUND

This application relates to sensing for a gas turbine engine, including sensing one or more conditions of a component during engine operation.

Gas turbine engines typically include a fan delivering air into a low pressure compressor section. The air is compressed in the low pressure compressor section, and passed into a high pressure compressor section. From the high pressure compressor section the air is introduced into a combustor section where it is mixed with fuel and ignited. Products of this combustion pass downstream over a high pressure turbine section, and then a low pressure turbine section to extract energy for driving the fan. The condition of rotatable components of the fan, compressor sections and turbine sections may vary during operation of the engine.

SUMMARY

A sensor assembly for a gas turbine engine according to an example of the present disclosure includes a substrate layer formed on a localized surface of a rotatable gas turbine engine component, and at least one pair of transducers deposited on the substrate layer.

In a further embodiment of any of the foregoing embodiments, the localized surface is contoured.

In a further embodiment of any of the foregoing embodiments, the substrate layer is responsive to one or more signals communicated from one of the at least one pair of transducers.

In a further embodiment of any of the foregoing embodiments, the substrate layer comprises a piezoelectric material.

In a further embodiment of any of the foregoing embodiments, each transducer of the at least one pair of transducers includes a first set of electrodes interdigitated with a second set of electrodes.

A further embodiment of any of the foregoing embodiments includes at least one pair of reflectors formed on the substrate layer, with each pair of the at least one pair of transducers between a respective pair of the at least one pair of reflectors.

A further embodiment of any of the foregoing embodiments includes at least one antenna coupled to the at least one pair of transducers. The at least one antenna has an input portion and an output portion. The input portion is coupled to the first set of electrodes. The output portion is coupled to the second set of electrodes.

A further embodiment of any of the foregoing embodiments includes a controller that has a transceiver in communication with the at least one antenna.

In a further embodiment of any of the foregoing embodiments, the at least one pair of transducers includes first and second transducers, and the substrate layer causes an output signal to be communicated from the second transducer to the transceiver in response to an input signal communicated from the transceiver to the first transducer.

In a further embodiment of any of the foregoing embodiments, the rotatable gas turbine engine component is a rotatable airfoil.

A gas turbine engine according to an example of the present disclosure includes a sensor assembly that has a substrate layer formed on a localized surface of a rotatable component of the gas turbine engine, and at least one pair of transducers deposited on the substrate layer.

In a further embodiment of any of the foregoing embodiments, the localized surface includes at least one contour, and the substrate layer substantially conforms to the at least one contour.

A further embodiment of any of the foregoing embodiments includes at least one antenna coupled to the at least one pair of transducers, and a controller including a transceiver. The controller is mechanically attached to a static structure of the gas turbine engine such that the rotatable component is spaced apart from the static structure to define a clearance gap, with the transceiver and the at least one antenna in communication through the clearance gap.

In a further embodiment of any of the foregoing embodiments, the at least one pair of transducers includes first and second transducers, and the substrate layer causes an output signal to be communicated from the second transducer to the transceiver in response to an input signal communicated from the transceiver to the first transducer.

In a further embodiment of any of the foregoing embodiments, the output signal relates to a present condition of the rotatable component adjacent the localized surface.

A method of fabrication for a rotatable gas turbine engine component according to an example of the present disclosure includes printing a substrate layer on a localized surface of the rotatable gas turbine engine component, and depositing first and second transducers on the substrate layer. The substrate layer is responsive to an input signal communicated from the first transducer.

In a further embodiment of any of the foregoing embodiments, the localized surface includes at least one contour. The step of printing the substrate layer includes printing the substrate layer on the at least one contour.

In a further embodiment of any of the foregoing embodiments, the substrate layer comprises a piezoelectric material.

A further embodiment of any of the foregoing embodiments includes coupling an antenna to the first and second transducers. Each of the first and second transducers have a first set of electrodes interdigitated with a second set of electrodes.

In a further embodiment of any of the foregoing embodiments, the rotatable gas turbine engine component is a rotatable airfoil or a rotatable shaft driven by a turbine.

The various features and advantages of this disclosure will become apparent to those skilled in the art from the following detailed description. The drawings that accompany the detailed description can be briefly described as follows.

BRIEF DESCRIPTION OF THE DRAWINGS

Like reference numbers and designations in the various drawings indicate like elements.

DETAILED DESCRIPTION

Figure 1:
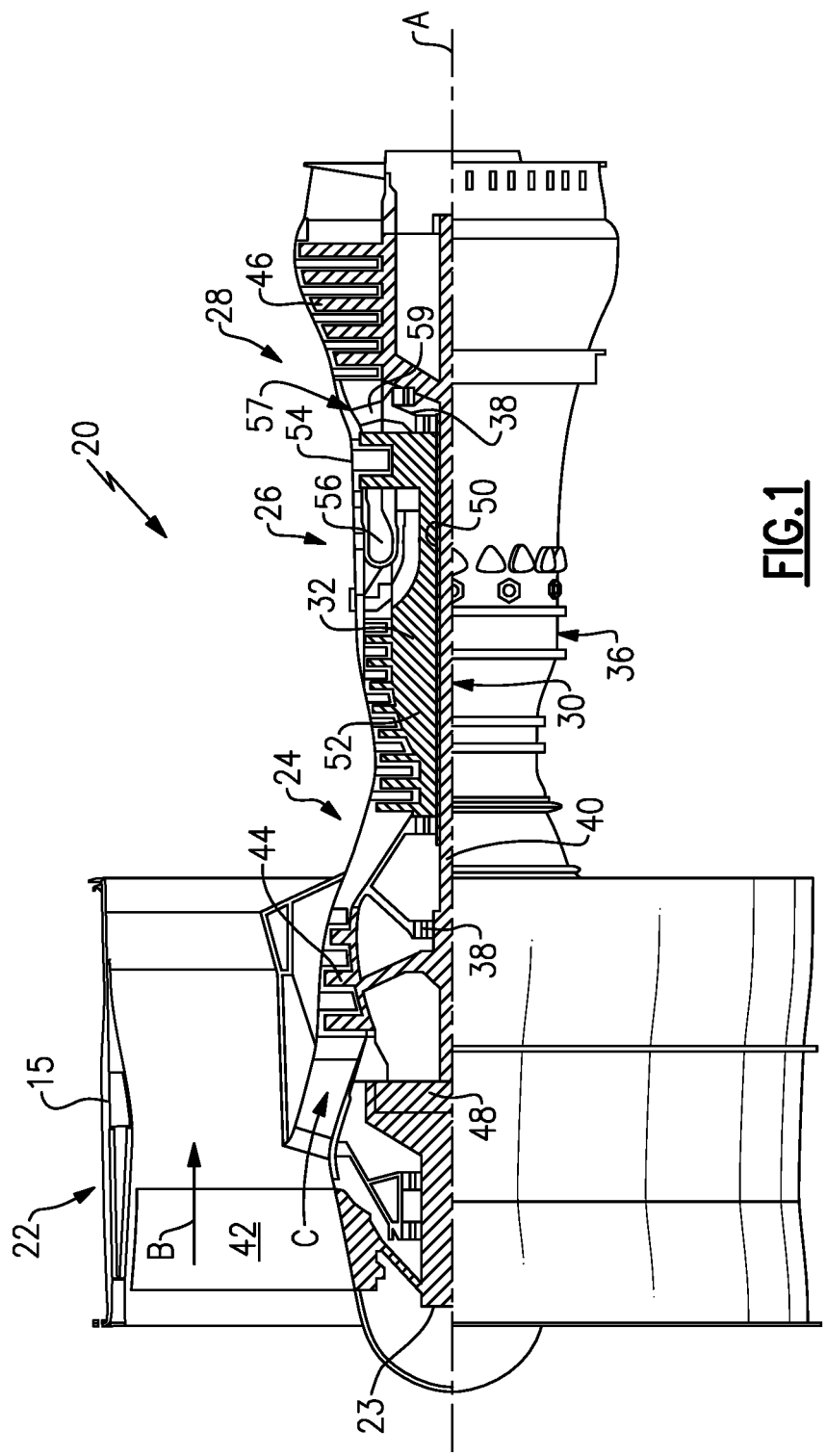
FIG. 1 illustrates a gas turbine engine.

FIG. 1 schematically illustrates a gas turbine engine 20. The gas turbine engine 20 is disclosed herein as a two-spool turbofan that generally incorporates a fan section 22, a compressor section 24, a combustor section 26 and a turbine section 28. Alternative engines might include an augmentor section (not shown) among other systems or features. The fan section 22 drives air along a bypass flow path B in a bypass duct defined within a nacelle 15, and also drives air along a core flow path C for compression and communication into the combustor section 26 then expansion through the turbine section 28. Although depicted as a two-spool turbofan gas turbine engine in the disclosed non-limiting embodiment, it should be understood that the concepts described herein are not limited to use with two-spool turbofans as the teachings may be applied to other types of turbine engines including three-spool architectures.

The exemplary engine 20 generally includes a low speed spool 30 and a high speed spool 32 mounted for rotation about an engine central longitudinal axis A relative to an engine static structure 36 via several bearing systems 38. It should be understood that various bearing systems 38 at various locations may alternatively or additionally be provided, and the location of bearing systems 38 may be varied as appropriate to the application.

The low speed spool 30 generally includes an inner shaft 40 that interconnects a fan 42, a first (or low) pressure compressor 44 and a first (or low) pressure turbine 46. The inner shaft 40 is connected to the fan 42 through a speed change mechanism, which in exemplary gas turbine engine 20 is illustrated as a geared architecture 48 to drive the fan 42 at a lower speed than the low speed spool 30. The high speed spool 32 includes an outer shaft 50 that interconnects a second (or high) pressure compressor 52 and a second (or high) pressure turbine 54. A combustor 56 is arranged in exemplary gas turbine 20 between the high pressure compressor 52 and the high pressure turbine 54. A mid-turbine frame 57 of the engine static structure 36 is arranged generally between the high pressure turbine 54 and the low pressure turbine 46. The mid-turbine frame 57 further supports bearing systems 38 in the turbine section 28. The inner shaft 40 and the outer shaft 50 are concentric and rotate via bearing systems 38 about the engine central longitudinal axis A which is collinear with their longitudinal axes.

The core airflow is compressed by the low pressure compressor 44 then the high pressure compressor 52, mixed and burned with fuel in the combustor 56, then expanded over the high pressure turbine 54 and low pressure turbine 46. The mid-turbine frame 57 includes airfoils 59 which are in the core airflow path C. The turbines 46, 54 rotationally drive the respective low speed spool 30 and high speed spool 32 in response to the expansion. It will be appreciated that each of the positions of the fan section 22, compressor section 24, combustor section 26, turbine section 28, and fan drive gear system 48 may be varied. For example, gear system 48 may be located aft of combustor section 26 or even aft of turbine section 28, and fan section 22 may be positioned forward or aft of the location of gear system 48.

The engine 20 in one example is a high-bypass geared aircraft engine. In a further example, the engine 20 bypass ratio is greater than about six (6), with an example embodiment being greater than about ten (10), the geared architecture 48 is an epicyclic gear train, such as a planetary gear system or other gear system, with a gear reduction ratio of greater than about 2.3 and the low pressure turbine 46 has a pressure ratio that is greater than about five. In one disclosed embodiment, the engine 20 bypass ratio is greater than about ten (10:1), the fan diameter is significantly larger than that of the low pressure compressor 44, and the low pressure turbine 46 has a pressure ratio that is greater than about five 5:1. Low pressure turbine 46 pressure ratio is pressure measured prior to inlet of low pressure turbine 46 as related to the pressure at the outlet of the low pressure turbine 46 prior to an exhaust nozzle. The geared architecture 48 may be an epicycle gear train, such as a planetary gear system or other gear system, with a gear reduction ratio of greater than about 2.3:1. It should be understood, however, that the above parameters are only exemplary of one embodiment of a geared architecture engine and that the present invention is applicable to other gas turbine engines including direct drive turbofans.

A significant amount of thrust is provided by the bypass flow B due to the high bypass ratio. The fan section 22 of the engine 20 is designed for a particular flight condition—typically cruise at about 0.8 Mach and about 35,000 feet (10,668 meters). The flight condition of 0.8 Mach and 35,000 ft (10,668 meters), with the engine at its best fuel consumption—also known as "bucket cruise Thrust Specific Fuel Consumption ('TSFC')"—is the industry standard parameter of lbm of fuel being burned divided by lbf of thrust the engine produces at that minimum point. "Low fan pressure ratio" is the pressure ratio across the fan blade alone, without a Fan Exit Guide Vane ("FEGV") system. The low fan pressure ratio as disclosed herein according to one non-limiting embodiment is less than about 1.45. "Low corrected fan tip speed" is the actual fan tip speed in ft/sec divided by an industry standard temperature correction of $[(\text{Tram} \,°\, R)/(518.7°\, R)]^{0.5}$. The "Low corrected fan tip speed" as disclosed herein according to one non-limiting embodiment is less than about 1150 ft/second (350.5 meters/second).

Figure 2:
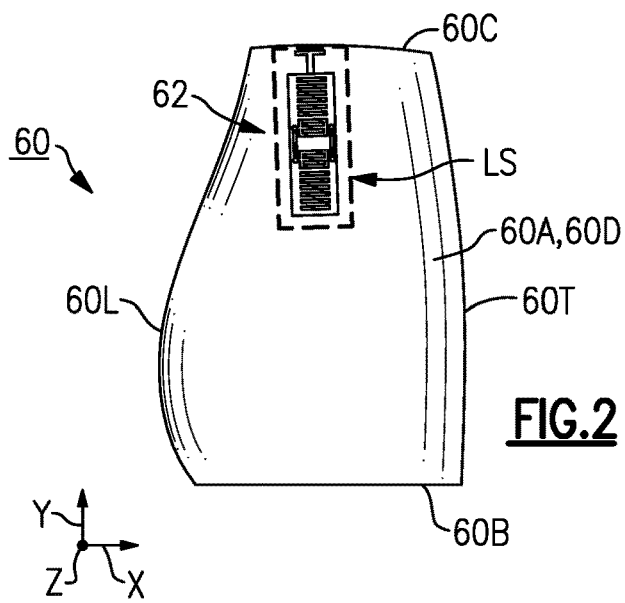
FIG. 2 illustrates a component including a sensor assembly according to an embodiment.

FIG. 2 illustrates a component 60 according to an embodiment. The component 60 can be a rotatable or moving gas turbine engine component such as one or more components of the engine 20 (FIG. 1). In some embodiments, the component 60 is a rotatable shaft driven by a turbine, such as inner or outer shaft 40, 50 or a fan rotor 23 of the fan section 22 (FIG. 1). In the illustrated embodiment of FIG. 2, the component 60 is a rotatable airfoil including an airfoil body 60A extending between a platform section 60B and an airfoil tip 60C. The rotatable airfoil can be an airfoil in the fan 42, compressor section 24 or turbine section 28, for example. Other rotatable components can benefit from the teachings herein, including one or more components of the low speed spool 30 and a high speed spool 32 (FIG. 1). Static components can also benefit from the teachings herein, including one or more static vanes in the compressor section 24 or turbine section 28. Other systems can also benefit from the teachings herein, including marine and land based turbine systems.

In some embodiments, the component 60 comprises a metal or metal alloy such as aluminum or titanium. In other embodiments, the component 60 is a composite blade which can be incorporated in the fan 42 (FIG. 1). Various composite materials can include, but are not limited to, two dimensional or three-dimensional composites such as carbon fiber lay-ups or three-dimensional woven carbon fiber. The composite may be formed from a plurality of braided yarns such as carbon fibers. Other materials can be utilized, such as fiberglass, Kevlar®, a ceramic such as Nextel™, and a polyethylene such as Spectra®. The composite can be formed from a plurality of uni-tape plies or a fabric. The fabric can include woven or interlaced fibers, for example.

The component 60 includes a sensor assembly 62 for sensing one or more conditions of the component 60. In the illustrated embodiment of FIG. 2, the sensor assembly 62 is situated at or otherwise adjacent to the airfoil tip 60C. In the illustrated embodiment of FIG. 3, component 60' includes a sensor assembly 62' situated at or otherwise adjacent to platform section 60B'. The sensor assembly 62 can be situated at other locations of the component 60, such as a mid-span 60D, leading edge 60L and/or trailing edge 60E, as illustrated by sensor assembly 62".

Figure 3:
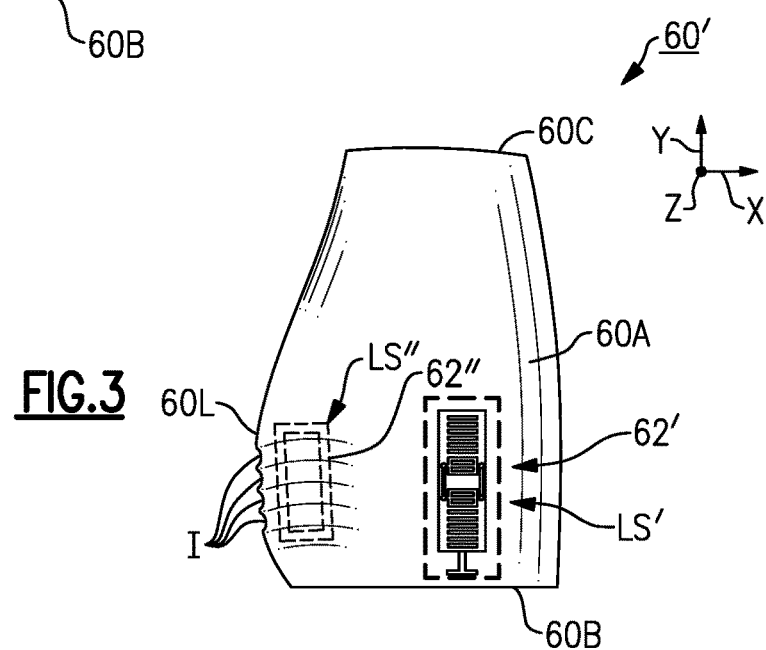
FIG. 3 illustrates a component including a sensor assembly according to another embodiment.

The sensor assembly 62 is situated along a localized surface LS of the component 60. In some embodiments, the localized surface LS is a three dimensional surface including at least one contour. For the purposes of this disclosure, the term "contour" means a surface having a component that includes an arcuate or non-planar geometry. The sensor assembly 62 can be located at a localized surface defining a plurality of contours, each extending in one or more directions along the x, y and/or z-axes, such as localized surface LS" (FIG. 3). In the illustrated embodiment of FIG. 3, localized surface LS" defines or otherwise extends along two or more inflections I in a direction generally along the y-axis.

Figure 4:
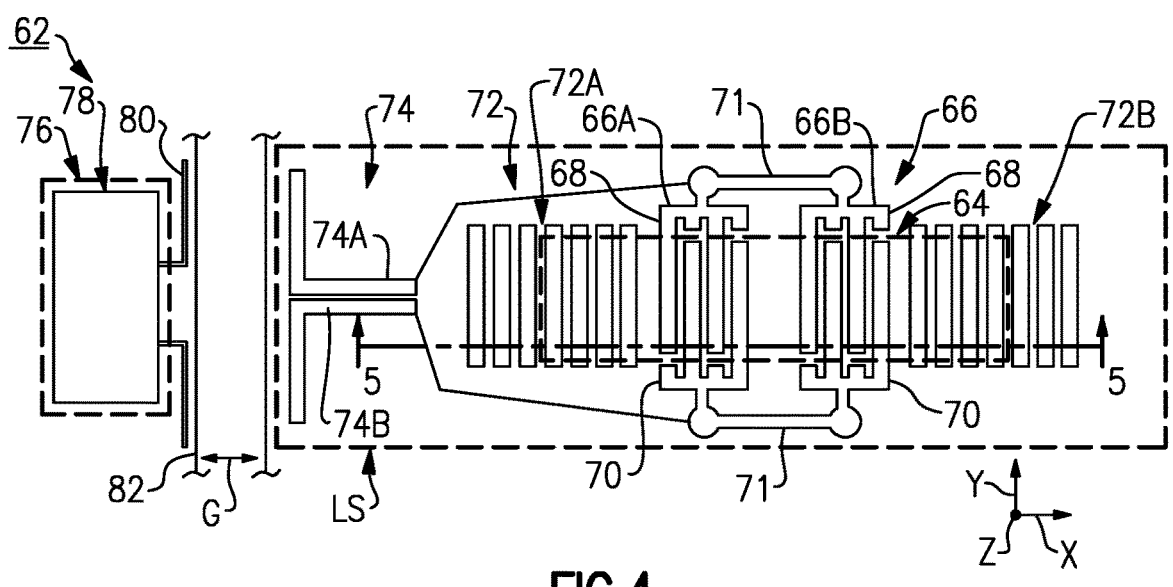
FIG. 4 illustrates the sensor assembly of FIG. 2.
Figure 5:
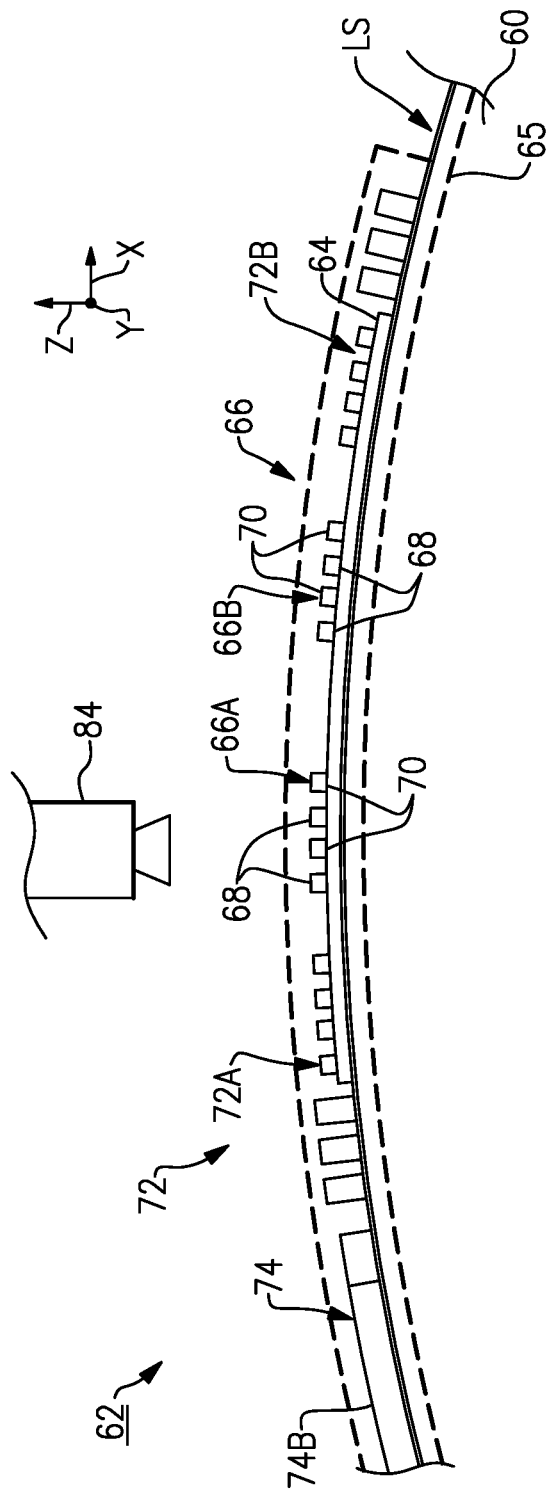
FIG. 5 illustrates a sectional view of the sensor assembly of FIG. 4 along line 5-5.

Referring to FIGS. 4 and 5, the sensor assembly 62 may be a wireless surface acoustic wave (SAW) sensor assembly. The sensor assembly 62 includes at least a substrate layer 64 and at least one pair of transducers 66 (one pair shown for illustrative purposes). The substrate layer 64 can be deposited or otherwise formed directly or indirectly on the localized surface LS such that the substrate layer 64 substantially conforms to a geometry of the localized surface LS, which can be contoured. Conforming the substrate layer 64 to the geometry of the localized surface LS of the component 60 can provide a relatively low-profile arrangement. The substrate layer 64 can have a generally rectangular or elliptical geometry, for example, and spans between the transducers 66.

The transducers 66 include at least a first (or input) transducer 66A and a second (or output) transducer 66B deposited or otherwise formed on the substrate layer 64. As illustrated, each transducer 66A, 66B includes a first set of electrodes 68 interdigitated with a second set of electrodes 70. The electrodes 68, 70 comprise a conductive material such as silver, or other conductive materials, and can have any width even as low as 1 millimeter or less. The respective sets of electrodes 68, 70 can be electrically coupled by a respective pair of bridges 71 (FIG. 4). The bridges 71 provide an ability of collecting reflecting signals and reading the output signals from either an input portion 74A or an output portion 74B of antenna 74 (FIG. 4).

The substrate layer 64 comprises a material which is responsive to one or more electrical input signals communicated from one of the transducers 66A, 66B, such as the first transducer 66A. The substrate layer 64 converts the electrical input signal to a mechanical signal that propagates or otherwise travels through the substrate layer 64. Example materials of the substrate layer 64 can include a piezoelectric (PZT) material such as lead zirconate titanate ($Pb[Zr_xTi_{1-x}]O_3$). Other example materials of the substrate layer 64 can include lithium niobate ($LiNbO3$) and polyvinylidene fluoride (PVDF), but other materials may also be used.

A condition of the component 60 adjacent the localized surface LS can influence the mechanical signal as the signal travels through the material of the substrate layer 64 between the first and second transducers 66A, 66B. The condition of the component 60 may cause a change in frequency and/or amplitude of the mechanical signal, for example. The mechanical signal can be output to one of the transducers 66A, 66B, such as the second transducer 66B, as an electrical output signal that carries the change in frequency and/or amplitude.

The relative spacing or "delay line" of the transducers and/or gaps or "pitch" between the sets of interdigitated electrodes can be defined such that the electrical signals and/or mechanical signal is communicated at a desired frequency, as is known. In some embodiments, the first and second sets of electrodes 68, 70 are arranged to define a line width of less than about 100.0 millimeters (μm), or more narrowly between about 15.0-25.0 micrometer (μm), a line thickness of less than about 20.0 μm, or more narrowly less than about 5.0 μm, and a period of less than about 200.0 μm, or more narrowly between about 30.0-50.0 μm, although other dimensions of line widths, thicknesses and periods can be utilized with the teachings herein.

In some embodiments, the input electrical signal is communicated in the radio frequency (RF) spectrum, although other frequencies can be utilized. A frequency of the input electrical signal and a frequency range of the expected output electrical signal can be selected to reduce electromagnetic interference (EMI) with other electrical components and subsystems of the engine or aircraft.

The input electrical signal can provide sufficient power such that the remote components of the sensor assembly 62 including the transducers 66A, 66B function as a passive device. This can increase efficiency and reduce system complexity by omitting the need for a dedicated power source to operate the remote components.

The sensor assembly 62 can include at least one pair of reflectors 72 at least partially deposited or otherwise formed on the substrate layer 64. In the illustrated embodiments of FIGS. 3 and 4, the reflectors 72 include a first reflector 72A and a second reflector 72B. The reflectors 72A, 72B are situated such that the pair of transducers 66 are between the respective pair of reflectors 72. The reflectors 72 can reflect signals back toward the substrate layer 64 to amplify the electrical output signal and to reduce EMI or other emissions.

The sensor assembly 62 can include at least one antenna 74 in electronic communication with the at least one pair of the transducers 66. The antenna 74 can be deposited or otherwise formed on the component 60 such that the antenna 74 substantially conforms to a geometry of the localized surface LS. The antenna 74 can have various geometries, including one or more elongated, curved or spiral shaped segments. In some embodiments, the antenna 74 is a batch antenna or a line antenna. In the illustrated embodiment of FIGS. 4 and 5, the antenna 74 includes the input portion 74A and the output portion 74B. The input portion 74A is in electronic communication with the first set of electrodes 68 and the output portion 74B is in electronic communication with the second set of electrodes 70.

The sensor assembly 62 can also include a controller 76 for interrogating the transducers 66. The controller 76 includes a transceiver 78 coupled to an antenna 80, which communicates with the antenna 74. The controller 76 can be mechanically attached to a static structure 82, such as a portion of the engine static structure 36 of the engine 20 (FIG. 1). The static structure 82 is spaced apart from the component 60 to define a clearance gap G (FIG. 4) through which the transceiver 78 and the antenna 74 communicate.

Figure 6:
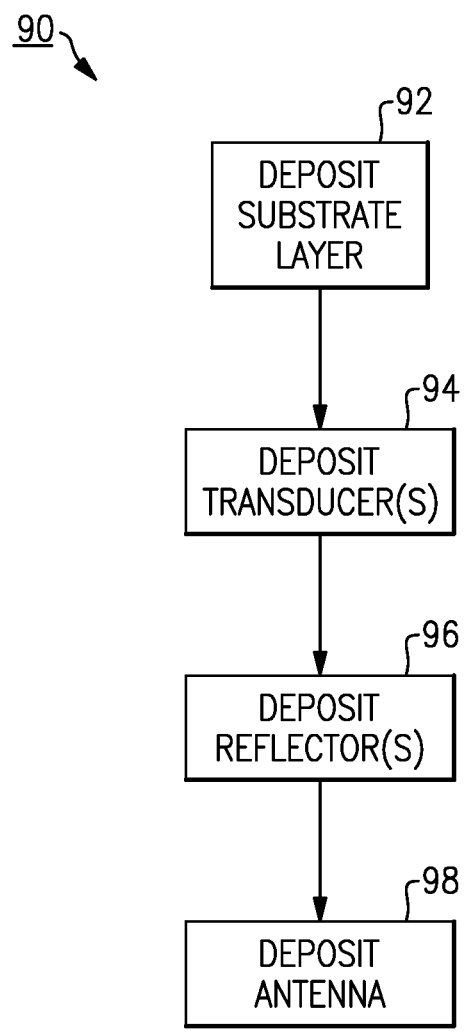
FIG. 6 illustrates a process for fabricating of a component including a sensor assembly, according to an embodiment.

Referring to FIGS. 5 and 6, an exemplary method in a flowchart 90 of fabrication of the component 60 including the sensor assembly 62 is as follows. At step 92, the substrate layer 64 is deposited on the localized surface LS of the component 60. Various techniques can be utilized to deposit or otherwise form the substrate layer 64 along the localized surface LS, including one or more additive manufacturing techniques. Deposition methods for the substrate layer 64, electrodes 68, 70, bridges 71 and antenna 74 include methods of printed electronics manufacturing also known as additive manufacturing or direct write methods. Such methods include aerosol jet printing, thermal spray, ink jet printing, extrusion printing and meso-plasma methods, as known. The deposition methods can use powders or inks (slurry) for fabrication. The printing heads can be controlled by a 5-axis machine or a robot to enable fabrication into a contour surface of the component 60 including the localized surface LS.

As illustrated, a device 84 is situated adjacent to the localized surface LS. The device 84 can be programmed with coordinate data corresponding to a geometry of the external surfaces of the component 60 including the localized surface LS.

The device 84 can be a 5-axis machine, for example, that includes a 3D printing head moveable in one or more passes in a direction along the x, y and/or z-axes to print or otherwise deposit the substrate layer 64 on the localized surface LS. Example techniques for printing include aerosol jet printing, micro extrusion, micro-cold spray deposition and jetting.

In embodiments, a body of the component 60 comprises a conductive material, including any of the materials disclosed herein. The device 84 can print or otherwise deposit a thin insulative layer 65 (shown in dashed lines) between an external surface of the component 60 to define the localized surface LS prior to printing the substrate layer 64. The insulative layer 65 may comprise a relatively high-temperature ceramic or polymer that conforms to a geometry of the external surface of the component 60, for example.

At step 94, the first and second transducers 66A, 66B are deposited or otherwise formed on at least a portion of the substrate layer 64. The electrodes 68, 70 may comprise a conductive metal ink, for example. At step 96, the reflectors 72 can be at least partially deposited or otherwise formed on the substrate layer 64. At step 98, the antenna 74 can also be deposited or otherwise formed on the substrate layer 64 such that the antenna 74 is electrically coupled to the electrodes 68, 70.

Printing of the substrate layer 64, transducers 66A, 66B, reflectors 72 and antenna 74 can reduce efficiency losses that may otherwise occur due to the incorporation of a relatively rigid, planar substrate and protrusion away from the localized surface LS, can improve reliability by reducing the need for solder joints and other connections, and can also reduce maintenance costs. In other embodiments, the substrate layer 64 is pre-fabricated and can have a geometry that substantially conforms to a geometry of the localized surface LS.

Operation of the sensor assembly 62 is as follows. To interrogate a state of the component 60, the substrate layer 64 causes an output signal to be communicated from the second transducer 66B to the transceiver 78 in response to an input signal communicated from the transceiver 78 to the first transducer 66A. For example, the input signal is an electrical signal communicated across the clearance gap G (FIG. 4), which causes a mechanical signal to propagate in the substrate layer 64. A shift in frequency and/or a change in amplitude of the mechanical signal is reflected in an output signal, which can be an electrical signal that is communicated from the second transducer 66B to the transceiver 78.

The transducer 78 can sweep a predetermined frequency range for the electrical output signal that corresponds to the electrical input signal and changes due to the shift in frequency and/or the change in amplitude caused by changes in a present condition of the component 60 adjacent the localized surface LS. For example, communication of an input signal of about 5 megahertz (MHz) may result in an output signal of about 3.5 MHz due to the input signal propagating through the substrate layer 64. Examples of the present condition can include temperature, strain, torque, vibration, and/or pressure at or otherwise adjacent to the localized surface LS. The controller 76 can be programmed with logic to deconvolute the output signal based on the change in frequency and/or amplitude to determine the present condition of the component 60 adjacent the localized surface LS during operation of the engine. For example, the controller 76 can be programmed to access one or more lookup tables relating to the sensed frequency and/or amplitude change to determine, estimate or infer a corresponding change in the present condition. The lookup tables may be defined based on pre-calibration data, for example.

The controller 76 can be programmed to interrogate two or more pairs of transducers 66 each located at a different localized surface LS of the same component 60 and/or different components 60. For example, the controller 76 can be programmed to interrogate an array of airfoils each provided with a substrate layer 64, a pair of transducers 66, an antenna 74 and other components disclosed herein.

Information relating to the present condition can be communicated from the controller 76 to a full authority digital engine control (FADEC), an electronic engine control (EEC), or another subsystem of the engine or aircraft, for example, to monitor one or more conditions of the component 60 and/or cause a change in a condition of the engine 20 or aircraft during operation. In some embodiments, a rotational speed of the inner and or outer shafts 40, 50 or the fan 42, or an amount of thrust of the engine 20, can be varied in response to the shift in frequency and/or change in amplitude exceeding one or more predetermined thresholds. One or one or more conditions of the component 60 can also be monitored for diagnostics and/or prognostics. The sensor assembly 62 can also provide relatively accurate and reliable measurement of conditions of the rotatable component 60 for validation of materials, tools, structures and methodologies used in the design, construction, instrumentation, testing and/or validation of a gas turbine engine incorporating the component 60.

The controller 76 typically includes a processor, a memory and an interface. The processor may, for example only, be any type of known microprocessor having desired performance characteristics. The memory may, for example only, includes UVPROM, EEPROM, FLASH, RAM, ROM, DVD, CD, a hard drive, or other computer readable medium which may store data and the method for operation of the controller 76 of this description. The interface facilitates communication with the other systems or components of the engine 20 or aircraft, for example. In some embodiments, the controller 76 is a portion of a FADEC or an EEC, another system, or a stand-alone system.

It should be understood that relative positional terms such as "forward," "aft," "upper," "lower," "above," "below," and the like are with reference to the normal operational attitude of the vehicle and should not be considered otherwise limiting.

Although the different embodiments and examples have the specific components shown in the illustrations, embodiments of this disclosure are not limited to those particular combinations. It is possible to use some of the components or features from one of the embodiments or examples in combination with features or components from another one of the embodiments or examples.

Although particular step sequences are shown, described, and claimed, it should be understood that steps may be performed in any order, separated or combined unless otherwise indicated and will still benefit from the present disclosure.

The foregoing description is exemplary rather than defined by the limitations within. Various non-limiting embodiments are disclosed herein, however, one of ordinary skill in the art would recognize that various modifications and variations in light of the above teachings will fall within the scope of the appended claims. It is therefore to be understood that within the scope of the appended claims, the disclosure may be practiced other than as specifically described. For that reason the appended claims should be studied to determine true scope and content.

What is claimed is:

1. A sensor assembly for a gas turbine engine comprising:
   a substrate layer formed on a localized surface of a rotatable gas turbine engine component;
   at least one pair of transducers deposited on the substrate layer, wherein the at least one pair of transducers includes a first transducer and a second transducer, and each of the first transducer and the second transducer includes a first set of electrodes interdigitated with a second set of electrodes; and
   a first bridge and a second bridge deposited on the substrate layer, the first bridge electrically coupling the first set of electrodes of the first transducer and the first set of electrodes of the second transducer, and the second bridge electrically coupling the second set of electrodes of the first transducer and the second set of electrodes of the second transducer.

2. The sensor assembly as recited in claim 1, wherein the localized surface is contoured.

3. The sensor assembly as recited in claim 1, wherein the substrate layer is responsive to one or more signals communicated from one of the at least one pair of transducers.

4. The sensor assembly as recited in claim 3, wherein the substrate layer comprises a piezoelectric material.

5. The sensor assembly as recited in claim 1, further comprising at least one pair of reflectors formed on the substrate layer, with each pair of the at least one pair of transducers between a respective pair of the at least one pair of reflectors.

6. The sensor assembly as recited in claim 1, further comprising at least one antenna coupled to the at least one pair of transducers, wherein the at least one antenna includes an input portion and an output portion, the input portion coupled to the first set of electrodes, and the output portion coupled to the second set of electrodes.

7. The sensor assembly as recited in claim 6, further comprising a controller including a transceiver in communication with the at least one antenna.

8. The sensor assembly as recited in claim 7, wherein the substrate layer causes an output signal to be communicated from the second transducer to the transceiver in response to an input signal communicated from the transceiver to the first transducer.

9. The sensor assembly as recited in claim 1, wherein the rotatable gas turbine engine component is a rotatable airfoil.

10. The sensor assembly as recited in claim 8, wherein the rotatable gas turbine engine component is a fan blade.

11. A gas turbine engine comprising:
    a sensor assembly comprising:
      a substrate layer formed on a localized surface of a rotatable component of the gas turbine engine;
      at least one pair of transducers deposited on the substrate layer, wherein the at least one pair of transducers includes a first transducer and a second transducer, and each of the first transducer and the second transducer includes a first set of electrodes interdigitated with a second set of electrodes; and
      a first bridge and a second bridge deposited on the substrate layer, the first bridge electrically coupling the first set of electrodes of the first transducer and the first set of electrodes of the second transducer, and the second bridge electrically coupling the second set of electrodes of the first transducer and the second set of electrodes of the second transducer.

12. The gas turbine engine as recited in claim 11, wherein the localized surface includes at least one contour, and the substrate layer substantially conforms to the at least one contour.

13. The gas turbine engine as recited in claim 11, further comprising at least one antenna coupled to the at least one pair of transducers, and a controller including a transceiver, the controller mechanically attached to a static structure of the gas turbine engine such that the rotatable component is spaced apart from the static structure to define a clearance gap, with the transceiver and the at least one antenna in communication through the clearance gap.

14. The gas turbine engine as recited in claim 13, wherein the substrate layer causes an output signal to be communicated from the second transducer to the transceiver in response to an input signal communicated from the transceiver to the first transducer.

15. The gas turbine engine as recited in claim 14, wherein the output signal relates to a present condition of the rotatable component adjacent the localized surface.

16. The gas turbine engine as recited in claim 15, wherein the gas turbine engine includes a fan, a compressor, and a turbine, and wherein the rotatable component is a rotatable airfoil or a rotatable shaft driven by the turbine.

17. The gas turbine engine as recited in claim 16, wherein the localized surface includes a plurality of contours defining two or more inflections, and the substrate layer substantially conforms to the plurality of contours.

18. The gas turbine engine as recited in claim 17, wherein the rotatable airfoil is a fan blade of the fan.

19. The gas turbine engine as recited in claim 18, wherein the controller causes a rotational speed of the fan to vary in response to a shift in a parameter of a mechanical signal associated with the substrate layer that corresponds to the output signal to the controller.

20. The gas turbine engine as recited in claim 19, wherein the first and second sets of electrodes of the first transducer and the first and second sets of electrodes of the second transducer are arranged to define a line width between 15.0-25.0 μm, a line thickness of less than 5.0 μm, and a period between 30.0-50.0 μm.

* * * * *